(12) United States Patent
Signoff et al.

(10) Patent No.: US 8,981,845 B1
(45) Date of Patent: Mar. 17, 2015

(54) DIGITAL POWER AMPLIFIER

(71) Applicant: Marvell International Ltd., Hamilton (BM)

(72) Inventors: David M. Signoff, Mountain View, CA (US); Li Lin, Saratoga, CA (US); Renaldi Winoto, Danville, CA (US); Wayne A. Loeb, San Francisco, CA (US); Shu-Hsien Liao, Sunnyvale, CA (US); Ming He, Fremont, CA (US)

(73) Assignee: Marvell International Ltd., Hamilton (BM)

( * ) Notice: Subject to any disclaimer, the term of this patent is extended or adjusted under 35 U.S.C. 154(b) by 0 days.

(21) Appl. No.: 14/143,751

(22) Filed: Dec. 30, 2013

Related U.S. Application Data

(63) Continuation of application No. 13/490,901, filed on Jun. 7, 2012, now Pat. No. 8,638,168.

(60) Provisional application No. 61/507,974, filed on Jul. 14, 2011.

(51) Int. Cl.
*H03F 3/68* (2006.01)

(52) U.S. Cl.
CPC ...................................... *H03F 3/68* (2013.01)
USPC ...................................................... 330/124 R

(58) Field of Classification Search
CPC ... H03F 1/0288; H03F 3/24; H03F 2200/451; H03F 1/0222; H03F 2200/102; H03F 3/3042; H03F 1/0227; H03F 1/0266; H03F 3/211; H03F 3/602; H03F 3/604; H03F 3/72; H03F 1/028
USPC ...................................... 330/124 R, 136, 295
See application file for complete search history.

(56) References Cited

U.S. PATENT DOCUMENTS

| | | | |
|---|---|---|---|
| 6,211,734 B1 * | 4/2001 | Ahn | 330/149 |
| 6,359,506 B1 | 3/2002 | Camp et al. | |
| 6,587,511 B2 | 7/2003 | Barak et al. | |
| 6,825,719 B1 | 11/2004 | Barak et al. | |
| 7,054,597 B2 * | 5/2006 | Rosnell | 330/124 R |

(Continued)

OTHER PUBLICATIONS

Institute of Electrical and Electronics Engineers. Inc., Part 11: Wireless LAN Medium Access Control (MAC) and Physical Layer (PHY) Specifications. High-Speed Physical Layer in the 5 GHz Band, 1999, IEEE Std 802.11 a-1999.

Institute of Electrical and Electronics Engineers, Inc., Draft Supplement to Standard, Part 11: Wireless LAN Medium Access Control (MAC) and Physical Layer (PHY) Specifications, Further Higher Data Rate Extension in the 2.4 GHz Band, Apr. 2003, IEEE Std 802.11g/D8.2.

(Continued)

*Primary Examiner* — Khanh V Nguyen

(57) ABSTRACT

Systems and methods for power amplification using multiple digital amplifiers are provided. A power amplifier includes a first digital amplifier configured to process a digital input signal to generate a first analog output signal. The first analog output signal is configured to have a magnitude corresponding to amplitude information of the digital input signal. The power amplifier further includes a second digital amplifier configured to process an adjusted digital input signal to generate a second analog output signal. The second analog output signal is configured to have a magnitude corresponding to amplitude information of the adjusted digital input signal. An adjustment module configured to adjust amplitude information and phase information of the digital input signal generates the adjusted digital input signal. The digital input signal is adjusted to control a relationship between the first analog output signal and the second analog output signal.

18 Claims, 9 Drawing Sheets

(56) References Cited

U.S. PATENT DOCUMENTS

| | | | |
|---|---|---|---|
| 7,183,843 B1 | 2/2007 | Jones et al. | |
| 7,295,074 B2 * | 11/2007 | Wong et al. | 330/295 |
| 7,427,895 B1 * | 9/2008 | Okubo et al. | 330/124 R |
| 7,847,630 B2 * | 12/2010 | Okubo et al. | 330/124 R |
| 8,736,375 B2 * | 5/2014 | Murao | 330/295 |
| 2008/0039024 A1 * | 2/2008 | Ikeda et al. | 330/10 |
| 2010/0156528 A1 | 6/2010 | Couchman et al. | |
| 2010/0295610 A1 | 11/2010 | Svechtarov | |

OTHER PUBLICATIONS

Gunnam, Kiran, Multi-Rate Layered Decoder Architecture for Block LDPC Codes of the IEEE 802.11n Wireless Standard.

Institute of Electrical and Electronics Engineers, Inc., Draft Standard, Part 11: Wireless LAN Medium Access Control (MAC) and Physical Layer (PHY) Specifications, Amendment 4: Enhancements for Very High Throughput for Operation in Bands Below 6 GHz, Jan. 2012, IEEE P802.11 ac/D2.0.

* cited by examiner

DIGITAL POWER AMPLIFIER

CROSS-REFERENCE TO RELATED APPLICATIONS

This application is a continuation of U.S. patent application Ser. No. 13/490,901, filed on Jun. 7, 2012, which claims priority to U.S. Provisional Patent Application No. 61/507,974, filed Jul. 14, 2011, entitled "Doherty DAC Power Amplifier," which is herein incorporated by reference in its entirety.

TECHNICAL FIELD

The technology described herein relates generally to power amplifiers and more particularly to systems and methods for power amplification using multiple digital amplifiers.

BACKGROUND

A power amplifier may be a fundamental component of a wireless communications device, which may also include transceiver and power source components. In these devices, the power amplifier may be configured to amplify a radio frequency (RF) signal received from the transceiver to allow for communication with other wireless communications devices. The power source may be used to provide a working voltage to the power amplifier.

Two important characteristics of a power amplifier are its efficiency and linearity. Optimizing efficiency may be particularly important in wireless communications devices, where power may be at a premium. Linear operation of the power amplifier may also be important in wireless communications devices because a number of modulation schemes (e.g., IEEE 802.11, Bluetooth, Wi-Fi) may require an amount of linearity in order to avoid transmission errors. Further, nonlinearity may impact the spectral mask, which may be limited by particular standards and regulations of the Federal Communications Commission (FCC).

In power amplifiers, there may be tradeoffs between efficiency and linearity. Efficiency in power amplifiers is generally proportional to input drive level, with maximum efficiency occurring as the power amplifier approaches its maximum output power. Typically, however, power amplifiers cannot achieve linear operation when operating at the high output powers necessary to achieve maximum efficiency. Further, in order to achieve high data rates, some standards (e.g., WiFi, IEEE 802.11a, g, n, ac) use signals with large peak to average ratios (PAR). In order to meet linearity requirements for high PAR signals, the power amplifier may need to operate well under its peak power, which may significantly reduce the efficiency of the device.

SUMMARY

The present disclosure is directed to systems and methods for power amplification using multiple digital amplifiers. In one embodiment, a power amplifier includes a first digital amplifier configured to process a digital input signal to generate a first analog output signal. The first analog output signal is configured to have a magnitude corresponding to amplitude information of the digital input signal. The power amplifier further includes a second digital amplifier configured to process an adjusted digital input signal to generate a second analog output signal. The second analog output signal is configured to have a magnitude corresponding to amplitude information of the adjusted digital input signal. The first analog output signal and the second analog output signal are combined to create a combined analog output signal of the power amplifier. An adjustment module configured to adjust amplitude information and phase information of the digital input signal generates the adjusted digital input signal. The digital input signal is adjusted by the adjustment module to control a relationship between the first analog output signal and the second analog output signal.

The present disclosure is also directed to a method for power amplification. A digital input signal is processed by a first digital amplifier to generate a first analog output signal with a magnitude corresponding to amplitude information of the digital input signal. Amplitude information and phase information of the digital input signal are adjusted by an adjustment module to generate an adjusted digital input signal. The adjusted digital input signal is processed by a second digital amplifier to generate a second analog output signal with a magnitude corresponding to amplitude information of the adjusted digital input signal. The first analog output signal is combined with the second analog output signal to create a combined analog output signal. The digital input signal is adjusted by the adjustment module to control a relationship between the first analog output signal and the second analog output signal of the power amplifier.

DETAILED DESCRIPTION

Figure 1:
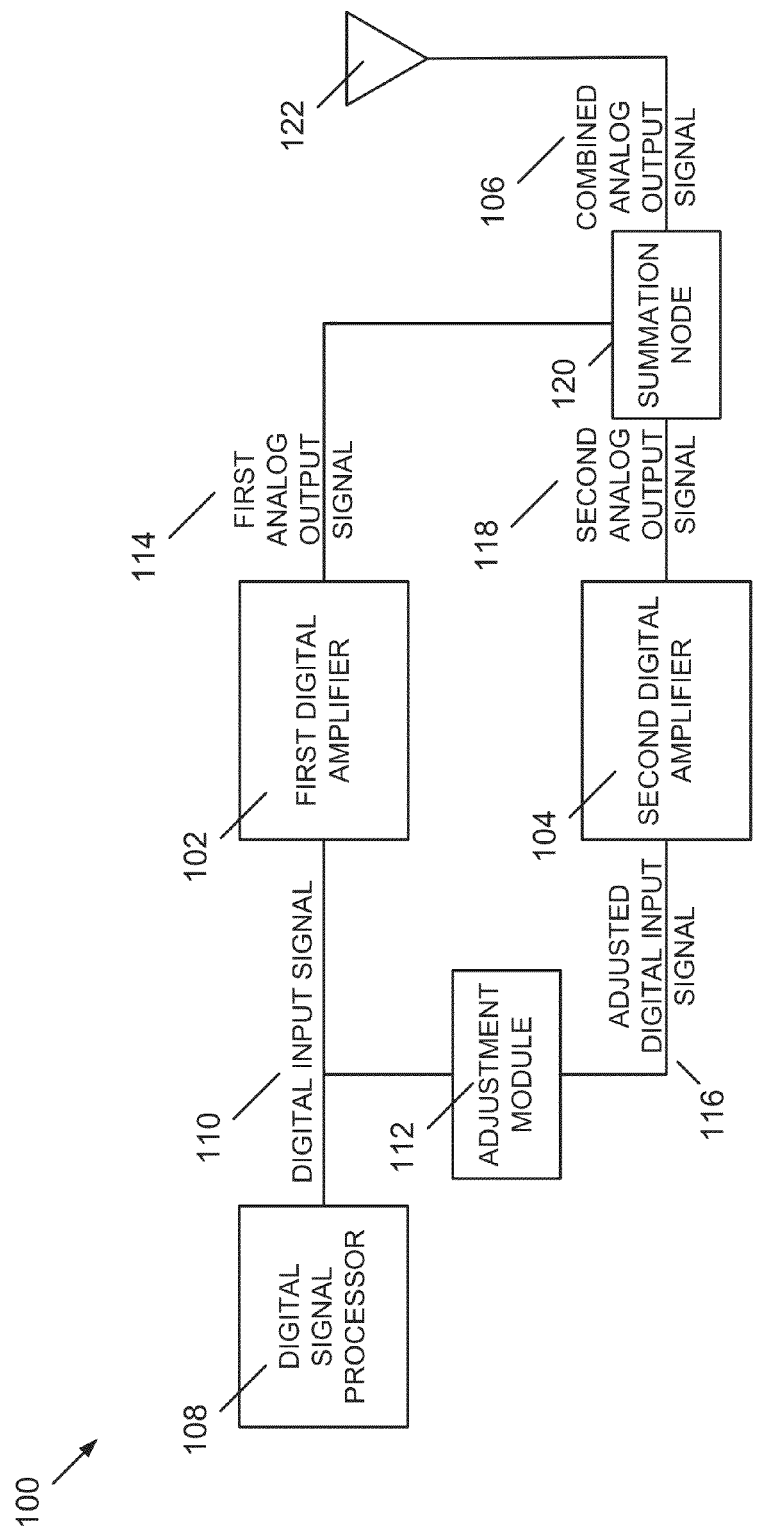
FIG. 1 is a circuit diagram illustrating circuit elements for an example of a power amplifier using first and second digital amplifiers to generate a combined analog output signal.

FIG. 1 is a circuit diagram illustrating circuit elements for an example of a power amplifier 100 using first and second digital amplifiers 102, 104 to generate a combined analog output signal 106. In FIG. 1, a digital signal processor 108 may generate a digital input signal 110 including digital codes. The digital codes may include amplitude information and phase information for the digital input signal 110 and may be received by the first digital amplifier 102 and an adjustment module 112. The first digital amplifier 102 may be configured to process the digital codes to generate a first analog output signal 114 with a magnitude corresponding to the amplitude information of the digital input signal 110. The adjustment module 112 may be configured to adjust the digital input signal 110 to generate an adjusted digital input signal 116 by adjusting the amplitude information and the phase information of the digital input signal 110. The adjusted digital input signal 116 may be received by the second digital amplifier 104, where the signal 116 is processed to generate a second analog output signal 118 with a magnitude corresponding to amplitude information of the adjusted digital input signal 116. The first analog output signal 114 and the second analog output signal 118 may be received at a summation node 120, which may be configured to combine the signals 114, 118 to produce the combined analog output signal 106. The combined analog output signal 106 may be received at a load terminal 122 (e.g., an antenna configured to transmit the combined analog output signal 106).

Figure 2:
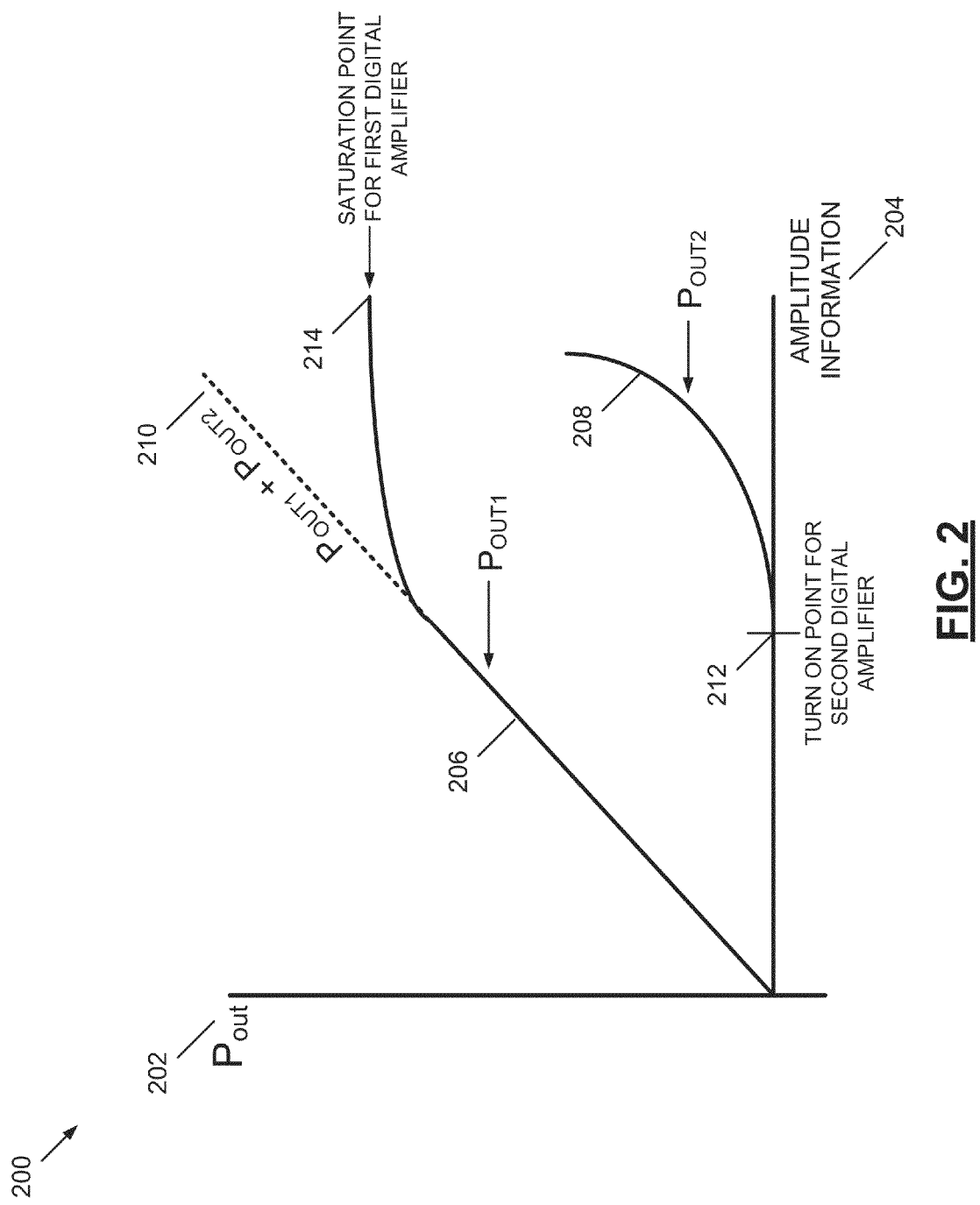
FIG. 2 is a graph depicting output power curves for an example of a power amplifier using first and second digital amplifiers.

FIG. 2 is a graph 200 depicting output power curves for an example of a power amplifier using first and second digital amplifiers. The y-axis of the graph 200 corresponds to output power 202 ($P_{out}$) for the power amplifier, and the x-axis corresponds to amplitude information of a digital input signal received by the power amplifier. The graph depicts first and second output power curves 206, 208 and a summation of these output power curves 210. With reference to FIG. 1, output power curve 206 may correspond to an output power produced by the first digital amplifier 102, and output power curve 208 may correspond to an output power produced by the second digital amplifier 104. As noted above, the first and second digital amplifiers 102, 104 may be configured to process amplitude information of a received input signal and to produce an analog output signal (e.g., $P_{out}$ 202 in FIG. 2) with a magnitude corresponding to the amplitude information. The summation of the first and second output power curves 210 may correspond to an output power function of the combined analog output signal 106, and hence, a total output power function of the power amplifier 100.

As illustrated in FIG. 2, the first output power curve 206 may increase linearly with increasing amplitude information 204 before beginning to level off and eventually reaching a saturation point 214. At the saturation point 214, the output power curve 206 remains flat despite increasing amplitude information 204. As is also illustrated in FIG. 2, the second output power curve 208 may have a value of substantially zero until a turn on point 212 is reached. The turn on point 212 may correspond to the amplitude information 204 at which the first output power curve 206 begins to approach the saturation point 214.

With reference again to FIG. 1, the use of two digital amplifiers 102, 104 may allow the power amplifier 100 to have desirable characteristics not present in either of the first or second digital amplifiers 102, 104 separately. These characteristics may include, for example, increased efficiency and/or linearity. To illustrate this, output power curve 206 of FIG. 2 may represent an output characteristic of the first digital amplifier 102, operating independently. As noted above, the output power curve 206 increases linearly until it approaches the saturation point 214. Although the first digital amplifier 102 may operate at a high efficiency near the saturation point 214, the loss of linearity at this point means that it may not be usable as a power amplifier because of the linearity requirements of some systems (e.g., wireless communications systems). However, by combining the second analog output signal 118 with the first analog output signal 114, both efficiency and linearity characteristics of the power amplifier 100 may be improved. Thus, when the first digital amplifier 102 approaches saturation, the second digital amplifier 104 can begin to output a non-zero second analog output signal 118 that can be combined with the first analog output signal 114 to improve linearity and/or efficiency characteristics of the power amplifier.

FIG. 2 illustrates the use of first and second digital amplifiers 102, 104 in this fashion. At turn on point 212, the first output power curve 214 begins to saturate, and the second output power curve 208 begins to increase from zero to compensate for the first output power curve's decreasing rate of increase. When combined (e.g., at summation node 120 of FIG. 1), the combined first and second output power curves 210 retain a linear shape. Further, when the amplifiers 102, 104 are combined in this manner, both may be operated at high powers within their saturation regions, allowing for higher efficiency.

Adjustment module 112 may play a role in creating the advantageous combination of analog output signals 114, 118. The adjustment module 112, by adjusting the amplitude information and phase information of the digital input signal 110 to generate the adjusted digital input signal 116, may control a relationship between the first and second analog output signals 114, 118. In particular, the digital input signal 110 may be adjusted in the adjusted digital input signal 116 to precisely control when the second digital amplifier 104 turns on 212 and a rate of increase of the second digital amplifier's output power curve 208 as a function of amplitude information. If the turn on voltage 212 and rate of increase of the second digital amplifier's output power curve 208 are controlled and aligned with the first digital amplifier's output power curve 206, the linearity and efficiency advantages noted above may be realized. Proper control of the relationship between the first and second analog output signals 114, 118 may be important because an improper alignment between the two signals may cause linearity and/or efficiency to degrade. Other relationships between the first and second analog output signals 114, 118 may be created by modifying operation of the adjustment module 112. In one example, the adjustment module 112 may be programmable, such that various programs may be executed by the adjustment module, with each program configured to produce a particular relationship between the output signals 114, 118.

Figure 3:
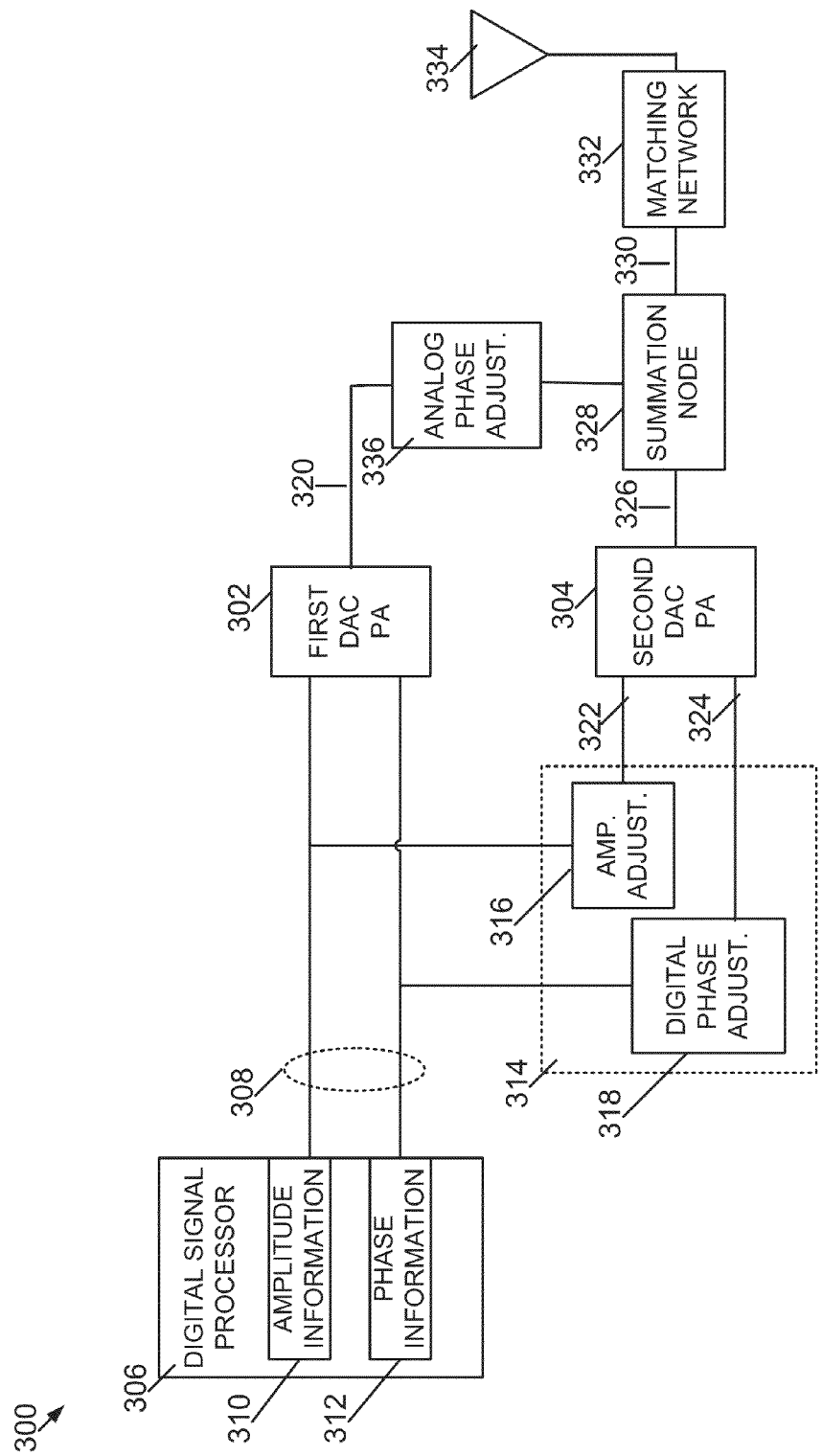
FIG. 3 is a circuit diagram illustrating circuit elements for an example of a power amplifier using first and second digital-to-analog converter power amplifiers (DAC PAs).

FIG. 3 is a circuit diagram illustrating circuit elements for an example of a power amplifier 300 using first and second digital-to-analog converter power amplifiers (DAC PAs) 302, 304. In FIG. 3, a digital signal processor 306 may generate a digital input signal 308 including amplitude information 310 and phase information 312. The amplitude information 310 and phase information 312 may be split into two separate paths before being recombined at the first and second DAC PAs 302, 304. The separate amplitude information 310 and phase information 312 paths may be received by the first DAC PA 302 and an adjustment module 314. The adjustment module 314 may include an amplitude adjustment module 316, configured to receive amplitude information 310, and a digital phase adjustment module 318 configured to receive phase information 312.

Similar to the first digital amplifier 102 of FIG. 1, the first DAC PA 302 may be configured to process digital codes of the digital input signal 308 to generate a first analog output signal 320 with a magnitude corresponding to the amplitude information 310. First and second DAC PAs 302, 304 may each include a plurality of smaller segments, with the magnitude of each DAC PA's output being controlled by a number of the segments that are turned on by a digital input signal. Thus, amplitude information 310 received by the first DAC PA 302 may control the number of segments that are turned on in the DAC PA 302 to control the magnitude of the first analog output signal 320.

Adjustment module 314 may be configured to adjust the amplitude information 310 and the phase information 312 of the digital input signal 308 to generate an adjusted digital input signal. The adjusted digital input signal may include adjusted amplitude information 322 and adjusted phase information 324, which may be received by the second DAC PA 304. The second DAC PA 304 may be configured to process the adjusted amplitude and phase information 322, 324 to generate a second analog output signal 326 with a magnitude corresponding to the adjusted amplitude information 322. The first and second analog output signals 320, 326 may be combined at a summation node 328 to produce a combined analog output signal 330. A matching network 332 may be used to maximize power transfer and minimize reflections at a load terminal 334.

The adjustment module 314 of FIG. 3 may be used to control a relationship between the first analog output signal 320 and the second analog output signal 326. The relationship may be controlled to give the power amplifier 300 desirable characteristics, including increased linearity and/or efficiency. To control the relationship, both amplitude information 310 and phase information 312 of the digital input signal 308 may be adjusted at the adjustment module 314. The amplitude adjustment module 316 of the adjustment module 314 may be configured to adjust the amplitude information 310 to control a relationship between an output signal of the second DAC PA 304 and the amplitude information function, as is described in further detail below. The digital phase adjustment module 318 of the adjustment module 314 may be configured to adjust the phase information 312 by a particular amount (e.g., 90 degrees) in the adjusted phase information 324, which may cause a phase of the second analog output signal 326 to be adjusted by the particular amount. To compensate for the phase shift in the second analog signal 326, an analog phase adjustment module 336 may adjust a phase of the first analog output signal 320 by the same particular amount. This may allow the first and second analog output signals 320, 326 to be in phase at the summation node 328. The analog phase adjustment module 336 may be an analog circuit element (e.g., a quarter-wavelength transmission line).

Because the adjustment module 314 processes digital signals, rather than analog signals, the adjustment module 314 enables digital control of the relationship between the first and second DAC PAs 302, 304 and may offer a level of programmability and control not available when working in the analog domain. Further, use of DAC PAs 302, 304, rather than analog amplifiers, may offer advantages due to their size. For example, alternate designs utilizing first and second analog amplifiers may require larger-sized class C analog amplifiers for the first or second analog amplifier. The DAC PA may produce current/voltage characteristics similar to the class C analog amplifier and may not be larger than an equivalent class AB analog amplifier. The smaller size of the DAC PA may result in a smaller chip size and a lower input capacitance, as compared to a larger-sized analog amplifier. Working in the digital domain may also be advantageous because the size of the digital phase adjustment module 318, a digital circuit element, may be smaller than an analog circuit element configured to perform the same phase adjustment (e.g., a quarter-wavelength transmission line). Further, use of the first and second DAC PAs 302, 304 may allow the amplitude information and phase information received by each to be pre-distorted in the digital domain (i.e., DPD) to cancel non-linearity in each power amplifier. In general, the direct digital control over the first and second DAC PAs 302, 304 may be used to utilize DPD to create improvements in performance.

Use of first and second DAC PAs 302, 304 in the configuration depicted in FIG. 3 may enable other advantageous characteristics. For example, if a quarter-wavelength transmission line is used as the analog phase adjustment module 336, an impedance inversion property of the quarter-wavelength transmission line may cause current provided by the second DAC PA 304 to reduce an apparent impedance of the load 334, as seen by the first DAC PA 302. As a result, the first DAC PA 302 may be able to supply more current, and therefore, more power to the load 334.

Figure 4B:
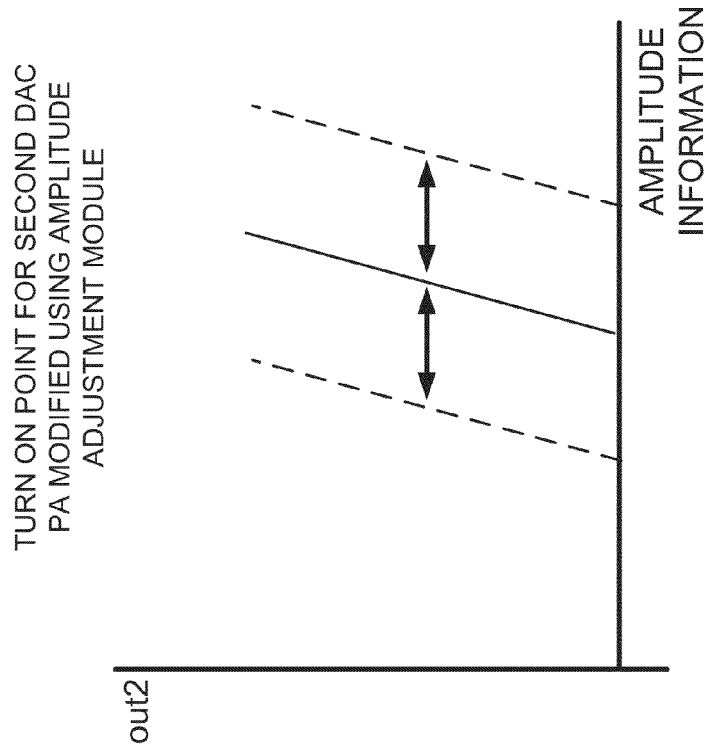
FIGS. 4A-4C are graphs depicting output current curves for first and second DAC PAs used together in an example of a power amplification configuration.
Figure 4A:
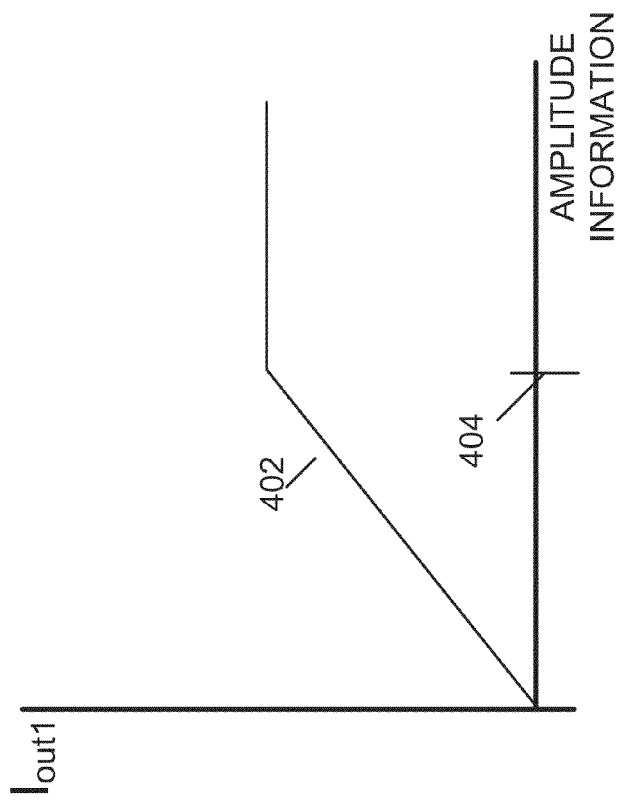
Figure 4C:
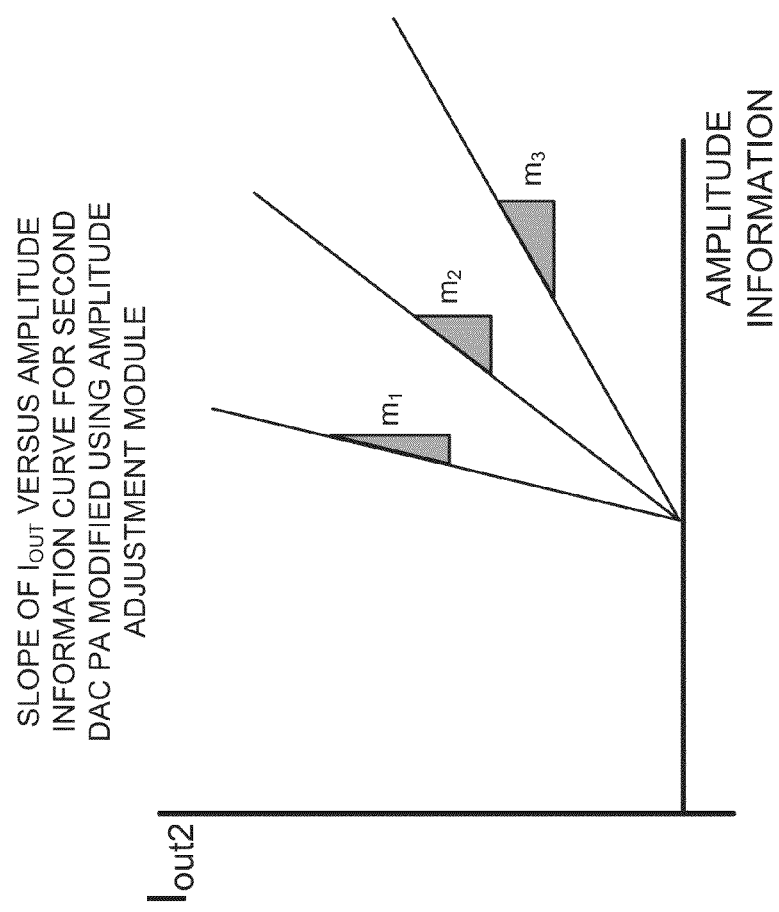

FIGS. 4A-4C are graphs depicting output current curves for first and second DAC PAs used together in an example of a power amplification configuration. The y-axis of each graph may correspond to output current, and the x-axis of each graph may correspond to amplitude information of a digital input signal received by the first and second DAC PAs 302, 304. With reference to FIG. 3, the graph of FIG. 4A may represent a relationship between output current for the first DAC PA 302 and amplitude information 402. As illustrated by the function 402, the output current for the first DAC PA 302 may increase linearly with increasing amplitude information before reaching a saturation point 404. Although efficiency of the first DAC PA 302 may be high when operating after the saturation point 404, the non-linearity of the output current may preclude it from being used in certain devices by itself.

However, as noted above with respect to FIG. 3, controlling a relationship between output signals of the first and second DAC PAs 302, 304 may be used to improve linearity and/or achieve other desirable characteristics for a power amplifier. In this regard, the amplitude adjustment module 316 of FIG. 3 may be configured to adjust an output current versus amplitude information function for the second DAC PA 304 to create a desirable relationship between the output signals of the first and second DAC PAs 302, 304.

FIG. 4B illustrates use of the amplitude adjustment module 316 to modify a turn on point of the second DAC PA 304. At amplitude information values below the turn on point, the second DAC PA 304 may be configured to produce no output current. The turn on point of the second DAC PA 304 may be related to the saturation point 404 of FIG. 4A, such that the second DAC PA 304 produces output current only as the first DAC PA 302 approaches saturation. The amplitude adjustment module 316 may modify amplitude information 310 prior to its receipt at the second DAC PA 304 in order to shift the turn on point of the second DAC PA 304, as shown in FIG. 4B.

FIG. 4C illustrates use of the amplitude adjustment module 316 to modify a rate of increase of output current for the second DAC PA 304. In FIG. 4C, the turn on point for the second DAC PA 304 is held constant, but the slope of the relationship between output current and amplitude information 402 is varied using the amplitude adjustment module 316. Achieving a proper slope value may be important for aligning the output of the first and second DAC PAs 302, 304 to create a linear output characteristic for the power amplifier 300 or other desirable characteristics. Although the output current characteristics of FIG. 4C increase linearly with amplitude information, other current functions may be implemented with amplitude adjustment module 316 (e.g., exponential functions, logarithmic functions, etc).

Because the power amplifiers of FIGS. 1 and 3 utilize adjustment modules 112, 314 that operate in the digital domain, the relationship between the first and second digital amplifiers may be precisely controlled in the digital domain. Thus, with reference to FIGS. 4B and 4C, the turn on point of the second DAC PA 304 may be controlled with a first parameter, and the rate of increase of the output current for the second DAC PA 304 may be controlled with a second parameter. By contrast, an alternate design utilizing first and second analog amplifiers may enable a biasing to be modified on the second analog amplifier to affect the amplifier's turn on point and slope values, thus allowing only a single control for two parameters. The higher level of programmability and control offered when operating in the digital domain may allow for a variety of advantageous relationships to be developed between the first and second digital amplifiers that would not be available in the analog domain.

Figure 5:
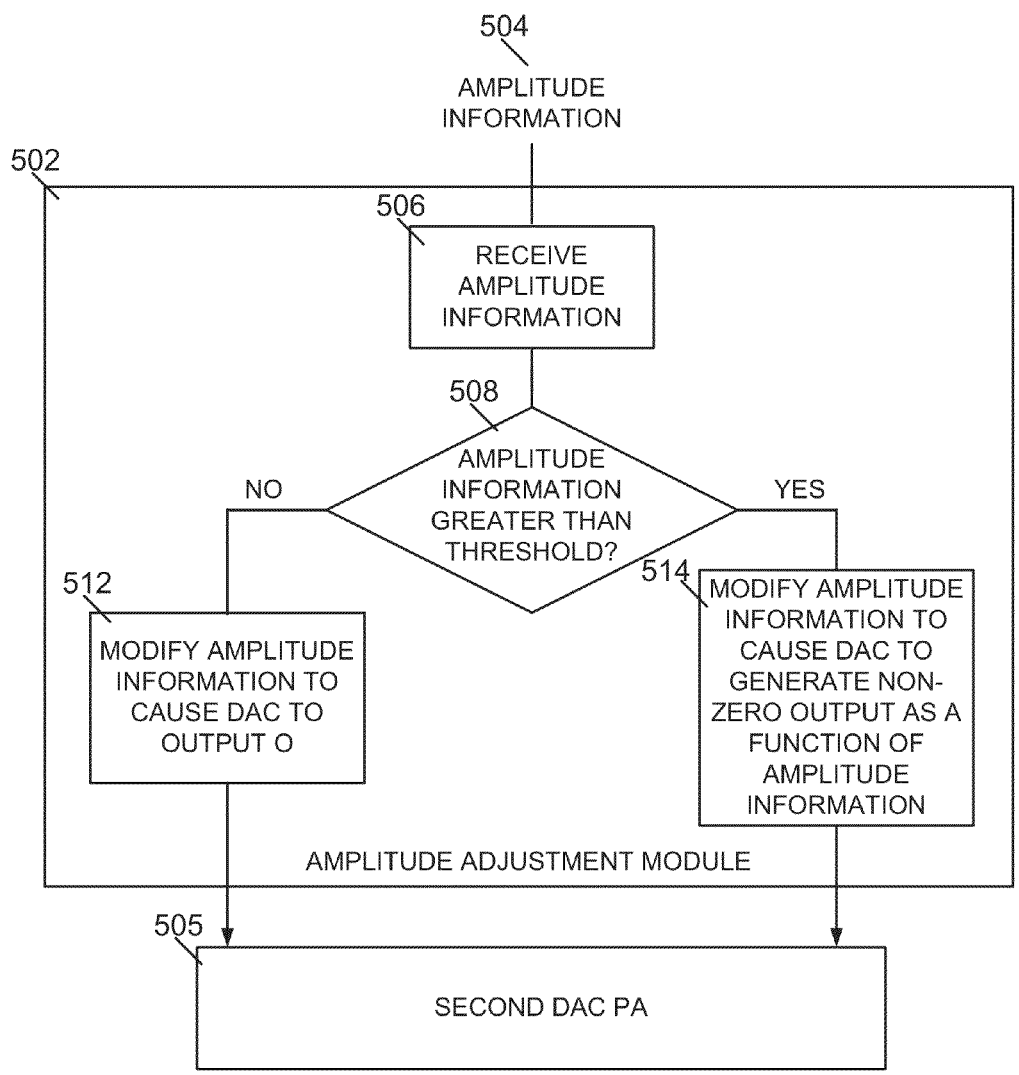
FIG. 5 depicts internal logic for an example of an amplitude adjustment module used to control a turn on point and output value slope for a second DAC PA.

FIG. 5 depicts internal logic for an example of an amplitude adjustment module 502 used to control a turn on point and output value slope for a second DAC PA 505. As described above, the amplitude adjustment module 502 may be configured to precisely control a relationship between first and second analog output signals by adjusting amplitude information 504 prior to its receipt at the second DAC PA 505. To make this adjustment, at 506, the amplitude adjustment module 502 may be configured to receive the amplitude information. At 508, a determination is made as to whether the amplitude information is greater than a threshold value. If, at 512, the amplitude information 504 is not greater than the threshold value, the amplitude information may be modified to cause the second DAC PA to have no output. Thus, the threshold value 508 may be used to set a turn on value for the second DAC PA 505, as is illustrated in FIG. 4B. If, at 514, the amplitude information 504 is greater than the threshold value, the amplitude information may be modified to cause the second DAC PA produce a non-zero output that varies as a function of the amplitude information. The particular output value versus amplitude information function, including slope of the output value, may be set by a program stored in the amplitude adjustment module 502. By controlling the turn on value and the output function of the second DAC PA 505, the amplitude adjustment module 502 may be used to control the relationship between the first and second analog output signals to enable efficiency enhancement, linearity enhancement, and/or other desirable characteristics. As noted above, working in the digital domain may offer a level of programmability not available in the analog domain (e.g., separate control of turn on point and output value slope for the second DAC PA 505).

Figure 6:
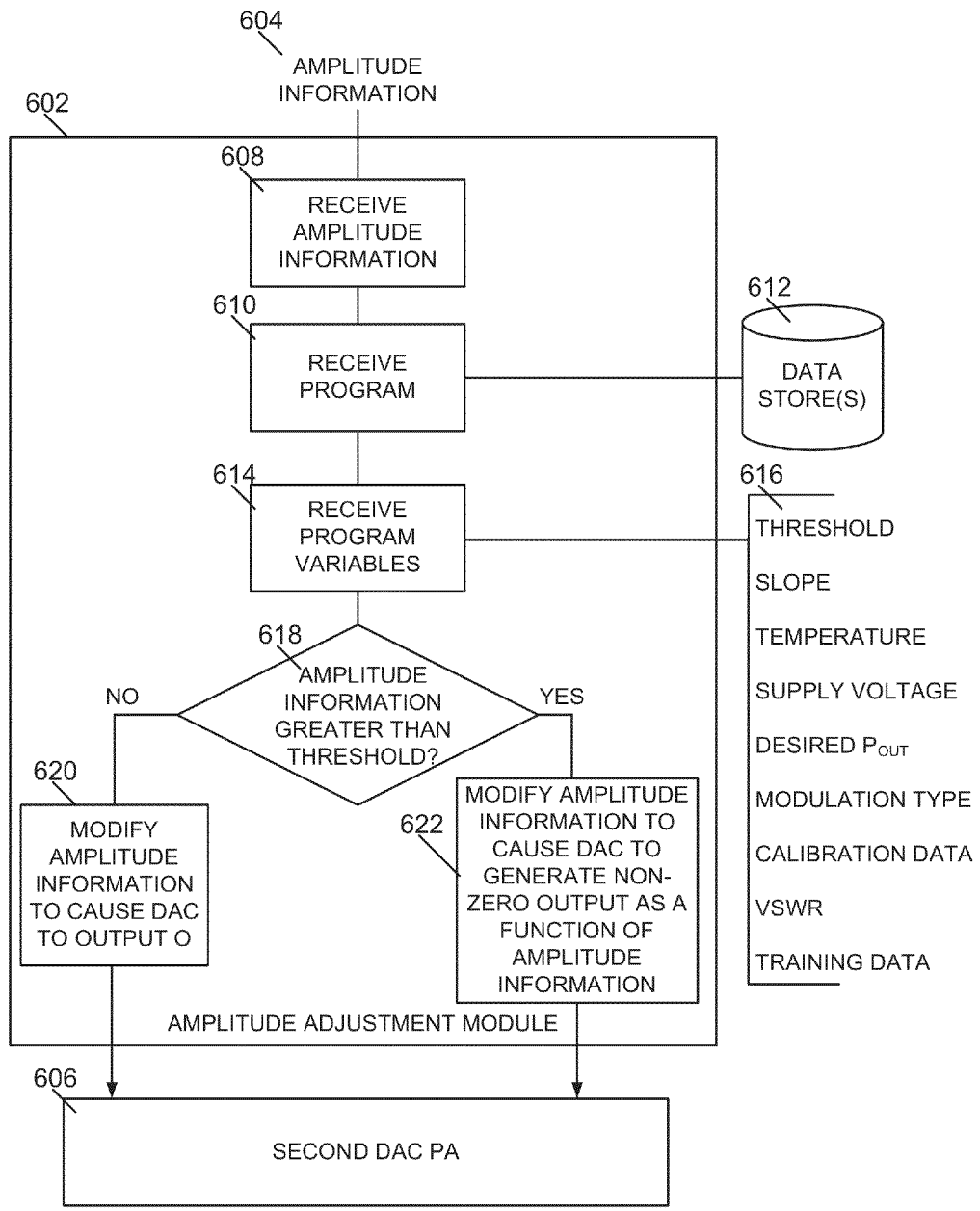
FIG. 6 depicts internal logic for an example of a programmable amplitude adjustment module used to control a turn on point and output value function for a second DAC PA.

FIG. 6 depicts internal logic for an example of a programmable amplitude adjustment module 602 used to control a turn on point and output value function for a second DAC PA 606. Like the amplitude adjustment module 502 of FIG. 5, the amplitude adjustment module 602 may be configured to precisely control a relationship between first and second analog output signals (e.g., signals 320, 326 of FIG. 3) by adjusting amplitude information 604 prior to its receipt at the second DAC PA 606. The amplitude adjustment module 602 may be programmable, such that the relationship between the first and second output signals may be modified by executing different programs.

At 608, amplitude information is received. At 610, the amplitude adjustment module 602 may be configured to receive a program (e.g., from one or more data stores 612). The received program may be configured to control the amplitude adjustment module 602 to create a particular relationship between the first and second analog output signals (e.g., to create a linear output power curve over a range of amplitude information values, as illustrated in FIG. 2). Further, at 614, the received program may be configured to receive program variables, which may be used to affect execution of the program. Examples of variables that may be received include a temperature variable, a supply voltage variable, a desired output power variable, a modulation type variable, a calibration data variable, a voltage standing wave ratio variable, and a training data variable 616. Receipt of such program variables 616 may be optional.

An example use of program variables 616 may involve the modulation type variable. Different wireless communications standards (e.g., WiFi, 802.11a/g/n/ac) may employ different modulation types, each with a characteristic peak-to-average ratio (PAR) and other characteristic values. At 614, the modulation type variable may be received by the amplitude adjustment module 602 to optimize a power amplifier for the different wireless standards. Receipt of the modulation type variable may be used to modify program execution to enable the amplitude adjustment module 602 to create a relationship between the first and second analog output signals that is tailored for the particular modulation type indicated by the received modulation type variable.

With reference again to FIG. 6, at 618, the amplitude adjustment module 602 may be configured to make a determination as to whether the amplitude information 604 is greater than a threshold value defined by the program. The threshold may be used to control a turn on point for the second DAC PA 606. For example, at 620, if the amplitude information is less than the threshold value, the amplitude information is modified to cause the second DAC PA 606 to have no output. If, at 622, the amplitude information is greater than the threshold value defined by the program, the amplitude information may be modified to cause the second DAC PA 606 to generate a non-zero output that varies as a function of the amplitude information. The particular output value versus amplitude information function, including slope of the output value, may be determined based on the received program 610 and/or the received variables 616. Thus, the amplitude adjustment module 602 and the received program and program variables 616 may be used to control a relationship between first and second DAC PAs by controlling separately the turn on point, output value slope, and/or other characteristics of the second DAC PA 606.

Figure 7:
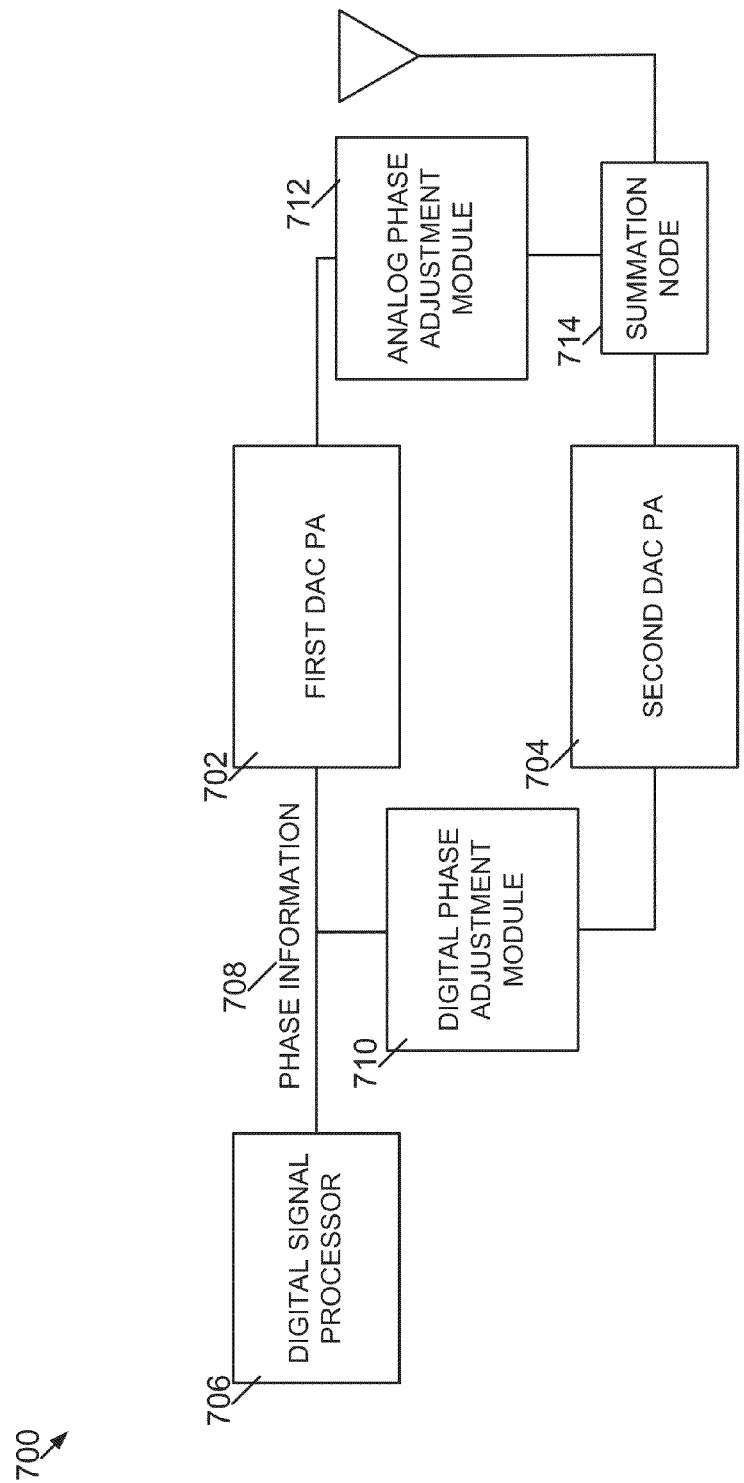
FIG. 7 is a circuit diagram illustrating phase paths in an example of a power amplifier using first and second DAC PAs.

FIG. 7 is a circuit diagram illustrating phase paths in an example of a power amplifier 700 using first and second DAC PAs 702, 704. The circuit diagram of FIG. 7 is similar to that of FIG. 3, except that in FIG. 7, amplitude information paths of the power amplifier 700 have been omitted to highlight phase information paths. In FIG. 7, any phase shifting occurring prior to the first and second DAC PAs 702, 704 may be performed in the digital domain. By contrast, any phase shifting occurring subsequent to the first and second DAC PAs 702, 704 may be performed in the analog domain.

A digital signal processor 706 may produce amplitude information and phase information 708, which may be split into two separate paths before being recombined at the first and second DAC PAs 702, 704 (e.g., separate paths 310, 312 of FIG. 3). Phase information 708 may be received by the first DAC PA 702 and a digital phase adjustment module 710. The digital phase adjustment module 710 operates in the digital domain and may include digital hardware designed to shift a phase of the phase information 708 by a particular amount (e.g., 90 degrees). The digital phase adjustment module 710 may be, for example, a quadrature mixer used to shift the phase information 708 by 90 degrees. The use of digital hardware to perform a digital phase shift may consume less area as compared to performing an analog phase shift. The shifted phase information may be received by the second DAC PA 704.

Because the first DAC PA 702 is configured to produce an analog output signal, a phase shift performed on its analog output signal may be performed in the analog domain. Thus, analog phase adjustment module 712 may be used to phase shift the analog output signal of the first DAC PA 702. The analog phase shift may be of an amount equal to the phase shift produced by the digital phase adjustment module 710.

This may enable the analog output signals produced by the first and second DAC PAs 702, 704 to be in phase when combined at summation node 714. The analog phase adjustment module 712 may be a quarter-wavelength transmission line configured to produce a 90 degree phase shift.

Figure 8:
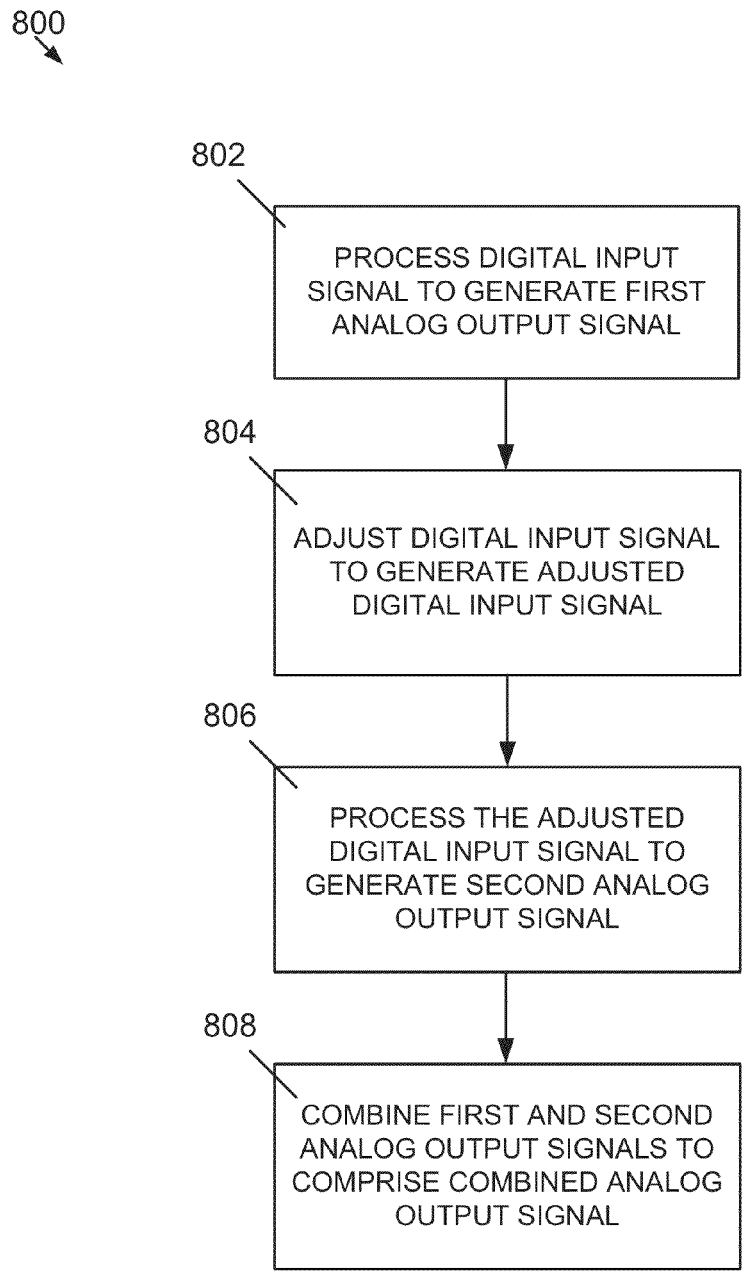
FIG. 8 is a flowchart illustrating a method for power amplification.

FIG. 8 is a flowchart illustrating a method for power amplification. At 802, a digital input signal is processed by a first digital amplifier to generate a first analog output signal. The first analog output signal has a magnitude corresponding to amplitude information of the digital input signal. At 804, amplitude information and phase information of the digital input signal are adjusted by an adjustment module to generate an adjusted digital input signal. At 806, the adjusted digital input signal is processed by a second digital amplifier to generate a second analog output signal with a magnitude corresponding to amplitude information of the adjusted digital input signal. At 808, the first analog output signal is combined with the second analog output signal to create a combined analog output signal. The amplitude information and phase information are adjusted to control a relationship between the first analog output signal and the second analog output signal of the power amplifier.

While the disclosure has been described in detail and with reference to specific embodiments thereof, it will be apparent to one skilled in the art that various changes and modifications can be made therein without departing from the spirit and scope of the embodiments. Thus, it is intended that the present disclosure cover the modifications and variations of this disclosure provided they come within the scope of the appended claims and their equivalents.

It should be understood that as used in the description herein and throughout the claims that follow, the meaning of "a," "an," and "the" includes plural reference unless the context clearly dictates otherwise. Also, as used in the description herein and throughout the claims that follow, the meaning of "in" includes "in" and "on" unless the context clearly dictates otherwise. Further, as used in the description herein and throughout the claims that follow, the meaning of "each" does not require "each and every" unless the context clearly dictates otherwise. Finally, as used in the description herein and throughout the claims that follow, the meanings of "and" and "or" include both the conjunctive and disjunctive and may be used interchangeably unless the context expressly dictates otherwise; the phrase "exclusive of" may be used to indicate situations where only the disjunctive meaning may apply.

It is claimed:

1. An electronic circuit comprising:
   an adjustment module configured to (i) receive an input signal and (ii) adjust the received input signal to generate an adjusted input signal;
   a first amplifier configured to generate, from the received input signal, a first output signal, wherein the first output signal has, with respect to amplitude of the input signal, a nonlinear region in which amplitude of the first output signal is nonlinear with respect to the amplitude of the input signal;
   a second amplifier configured to generate, from the adjusted input signal, a second output signal having an amplitude; and
   a summation node configured to generate a sum of the amplitude of the first output signal and the amplitude of the second output signal;
   wherein the adjusting by the adjustment module is configured to cause the second output signal to compensate for nonlinearity in the first output signal such that the sum of the amplitude of the first output signal and the amplitude of the second output signal is linear with respect to the amplitude of the received input signal in the nonlinear region of the first output signal.

2. The circuit of claim 1, wherein the adjusting by the adjustment module includes adjusting the amplitude of the received input signal.

3. The circuit of claim 1, wherein the adjusting by the adjustment module includes adjusting a phase of the received input signal.

4. The circuit of claim 3, wherein the first output signal is generated as a function of the phase of the received input signal, and wherein the second output signal is generated as a function of a phase of the adjusted input signal.

5. The circuit of claim 3, wherein the adjusting by the adjustment module includes adjusting the phase of the received input signal by a first amount, and wherein the circuit further comprises a post-amplifier phase adjustment module located between the first amplifier and the summation node, and wherein the post-amplifier phase adjustment module is configured to adjust a phase of the first output signal by a second amount that equals the first amount.

6. The circuit of claim 1, wherein the first output signal has, with respect to the amplitude of the input signal, a linear region followed by the nonlinear region, and wherein the adjusting by the adjustment module is configured for the amplitude of the second output signal to vary with the amplitude of the input signal only in the nonlinear region of the first output signal and not in the linear region of the first output signal.

7. The circuit of claim 6, wherein the adjusting by the adjustment module is configured for the second output signal to have an amplitude of substantially zero throughout the linear region.

8. The circuit of claim 1, wherein the input signal is digital, and wherein each of the first output signal and the second output signal is analog.

9. The circuit of claim 6, wherein the linear region of the first output signal and the nonlinear region of the first output signal meet at a threshold, such that the adjusting is configured for the second output signal to vary with the amplitude of the input signal only above the threshold and to not vary with the amplitude of the input signal below the threshold.

10. A method performable by an electronic circuit, the method comprising:
    receiving an input signal;
    adjusting the received input signal to generate an adjusted input signal;
    amplifying the received input signal to generate a first output signal, wherein the first output signal has, with respect to amplitude of the input signal, a nonlinear region in which amplitude of the first output signal is nonlinear with respect to the input signal;
    amplifying the adjusted input signal to generate a second output signal having an amplitude; and
    generating a sum of the amplitude of the first output signal and the amplitude of the second output signal;
    wherein the adjusting is configured to cause the second output signal to compensate for nonlinearity in the first output signal such that the sum of the amplitude of the first output signal and the amplitude of the second output signal is linear with respect to the amplitude of the received input signal in the nonlinear region of the first output signal.

11. The method of claim 10, wherein the adjusting includes adjusting the amplitude of the received input signal.

12. The method of claim 10, wherein the adjusting includes adjusting a phase of the received input signal.

13. The method of claim 12, wherein the first output signal is generated as a function of the phase of the received input signal, and wherein the second output signal is generated as a function of a phase of the adjusted input signal.

14. The method of claim 12, wherein the adjusting includes adjusting a phase of the received input signal by a first amount, and wherein the method further comprises:
   adjusting, prior to the generating of the sum, a phase of the first output signal by a second amount that equals the first amount.

15. The method of claim 10, wherein the first output signal has, with respect to the amplitude of the input signal, a linear region followed by the nonlinear region, and wherein the adjusting is configured for the amplitude of the second output signal to vary with the amplitude of the input signal only in the nonlinear region of the first output signal and not in the linear region of the first output signal.

16. The method of claim 15, wherein the adjusting is configured for the second output signal to have an amplitude of substantially zero throughout the linear region of the first output signal.

17. The method of claim 10, wherein the received input signal is digital, and wherein each of the first output signal and the second output signal is analog.

18. The method of claim 15, wherein the linear region of the first output signal and the nonlinear region of the first output signal meet at a threshold, such that the adjusting is configured for the second output signal to vary with the amplitude of the input signal only above the threshold and to not vary with the amplitude of the input signal below the threshold.

* * * * *